(12) United States Patent
Meer et al.

(10) Patent No.: US 11,201,423 B2
(45) Date of Patent: Dec. 14, 2021

(54) CARD CONNECTOR ASSEMBLIES WITH INTEGRATED COMPONENT SHIELDING

(71) Applicant: Google LLC, Mountain View, CA (US)

(72) Inventors: Daniel James Meer, Seattle, WA (US); Paul L. Fordham, Wauconda, IL (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 16/930,201

(22) Filed: Jul. 15, 2020

(65) Prior Publication Data
US 2021/0296805 A1 Sep. 23, 2021

(51) Int. Cl.
*H01R 12/71* (2011.01)
*H01R 13/6581* (2011.01)
*H01R 12/70* (2011.01)
*H01R 12/57* (2011.01)

(52) U.S. Cl.
CPC .......... *H01R 12/716* (2013.01); *H01R 12/57* (2013.01); *H01R 12/7005* (2013.01); *H01R 13/6581* (2013.01)

(58) Field of Classification Search
CPC .. H01R 12/716; H01R 12/57; H01R 12/7005; H01R 13/6581
USPC .......................................................... 439/65
See application file for complete search history.

(56) References Cited

U.S. PATENT DOCUMENTS

| | | | | |
|---|---|---|---|---|
| 8,308,514 B1 * | 11/2012 | Su | ........................ | H01R 27/02 439/630 |
| 8,579,640 B2 * | 11/2013 | Ho | ..................... | H01R 13/6271 439/159 |
| 8,932,080 B2 * | 1/2015 | Chang | .................... | H01R 12/52 439/607.1 |
| 9,048,594 B2 * | 6/2015 | Lim | ....................... | H01R 12/71 |
| 9,281,610 B2 * | 3/2016 | Ejiri | ................... | G06K 13/0831 |
| 9,436,854 B2 * | 9/2016 | Sarraf | .................. | G06K 7/0056 |
| 9,832,859 B2 * | 11/2017 | Lee | ....................... | H05K 1/0216 |
| 9,876,948 B2 * | 1/2018 | Wang | ................... | H04N 13/239 |
| 9,980,374 B2 * | 5/2018 | Pavageau | ............. | G06K 7/0091 |
| 9,999,165 B2 * | 6/2018 | Cho | ...................... | H05K 9/0026 |
| 10,010,016 B2 * | 6/2018 | Lim | ........................ | H01R 4/64 |
| 10,235,609 B1 * | 3/2019 | Jeon | ..................... | H04B 1/3818 |
| 10,312,625 B2 * | 6/2019 | Andre | ................ | H01R 12/7005 |
| 10,320,101 B2 * | 6/2019 | Brogan | ................ | H01R 12/714 |

(Continued)

FOREIGN PATENT DOCUMENTS

CN 201266962 7/2009

*Primary Examiner* — Peter G Leigh
(74) *Attorney, Agent, or Firm* — Colby Nipper PLLC

(57) ABSTRACT

This document describes techniques and apparatuses, including card connector assemblies with integrated component shielding for electronic devices. The card connector assembly includes frame, a riser, and a shielded contact block. The frame includes a card holder that receives a universal integrated circuit card (UICC). The riser supports the card holder spaced apart from the PCB. The shielded contact block configured for surface mounting to a printed circuit board (PCB) that includes an electronic component. The shielded contact block includes a recess that receives a portion of the electronic component therein, an interconnect that connects at least one pin on the UICC with at least one contact, and a component shield located in the recess. The component shield defines a shielded area configured to attenuate electromagnetic waves generated by the electronic component.

8 Claims, 6 Drawing Sheets

(56) References Cited

U.S. PATENT DOCUMENTS

| | | | |
|---|---|---|---|
| 10,334,341 B2* | 6/2019 | Niittyinpera | H04R 1/086 |
| 10,403,966 B2* | 9/2019 | Su | G06F 1/1626 |
| 10,547,144 B2* | 1/2020 | Mikawa | G06K 13/0831 |
| 10,594,348 B2* | 3/2020 | Yang | G06K 7/0052 |
| 10,594,845 B2* | 3/2020 | Hebert | G06F 1/1626 |
| 10,630,006 B2* | 4/2020 | Mancias | G06K 13/0806 |
| 2005/0219832 A1* | 10/2005 | Pawlenko | H05K 9/0073 361/818 |
| 2006/0040558 A1* | 2/2006 | Ho | H01R 13/658 439/607.01 |
| 2012/0108110 A1* | 5/2012 | Li | H01R 13/6581 439/660 |
| 2017/0012376 A1* | 1/2017 | Nakase | G06K 7/0021 |
| 2017/0093057 A1* | 3/2017 | Wang | G06K 7/00 |
| 2018/0316377 A1* | 11/2018 | Yang | G06K 7/00 |
| 2019/0272453 A1* | 9/2019 | Argyres | H04M 1/026 |
| 2019/0305405 A1* | 10/2019 | Im | H01Q 1/2283 |

\* cited by examiner

_US 11,201,423 B2_

CARD CONNECTOR ASSEMBLIES WITH INTEGRATED COMPONENT SHIELDING

SUMMARY

This document describes techniques and apparatuses including card connector assemblies with integrated component shielding for electronic devices. In general, in a first aspect, a card connector assembly is configured for surface mounting on a printed circuit board (PCB) that includes an electronic component. The card connector assembly includes frame, a riser, and a shielded contact block. The frame includes a card holder that receives a universal integrated circuit card (UICC). The riser supports the card holder spaced apart from the PCB. The shielded contact block configured for surface mounting to the PCB. The shielded contact block includes a recess that receives a portion of the electronic component therein, an interconnect that connects at least one pin on the UICC with at least one contact, and a component shield located in the recess. The component shield defines a shielded area configured for attenuate electromagnetic waves generated by the electronic component.

This Summary is provided to introduce simplified concepts of techniques and apparatuses including card connector assemblies with integrated component shielding for electronic devices, the concepts of which are further described below in the Detailed Description and Drawings. This Summary is not intended to identify essential features of the claimed subject matter, nor is it intended for use in determining the scope of the claimed subject matter.

BRIEF DESCRIPTION OF THE DRAWINGS

The details of one or more aspects of techniques and apparatuses including card connector assemblies with integrated component shielding for electronic devices are described in this document with reference to the following drawings. The same numbers are used throughout the drawings to reference like features and components.

DETAILED DESCRIPTION

This document describes techniques and apparatuses including card connector assemblies with integrated component shielding for electronic devices. The universal integrated circuit cards (UICC) that are utilized in electronic devices have a smaller form factor today than they did ten years ago. While they are smaller, the on-device card connector that receives the UICC still frequently takes up valuable space on the printed circuit board (PCB) of the electronic device. By integrating component shielding into a card connector assembly, the described techniques and apparatuses free up space on the PCB, which allows additional components to be added to the PCB and/or allows for a further reduction of the size of the PCB and the electronic device.

Figure 2:
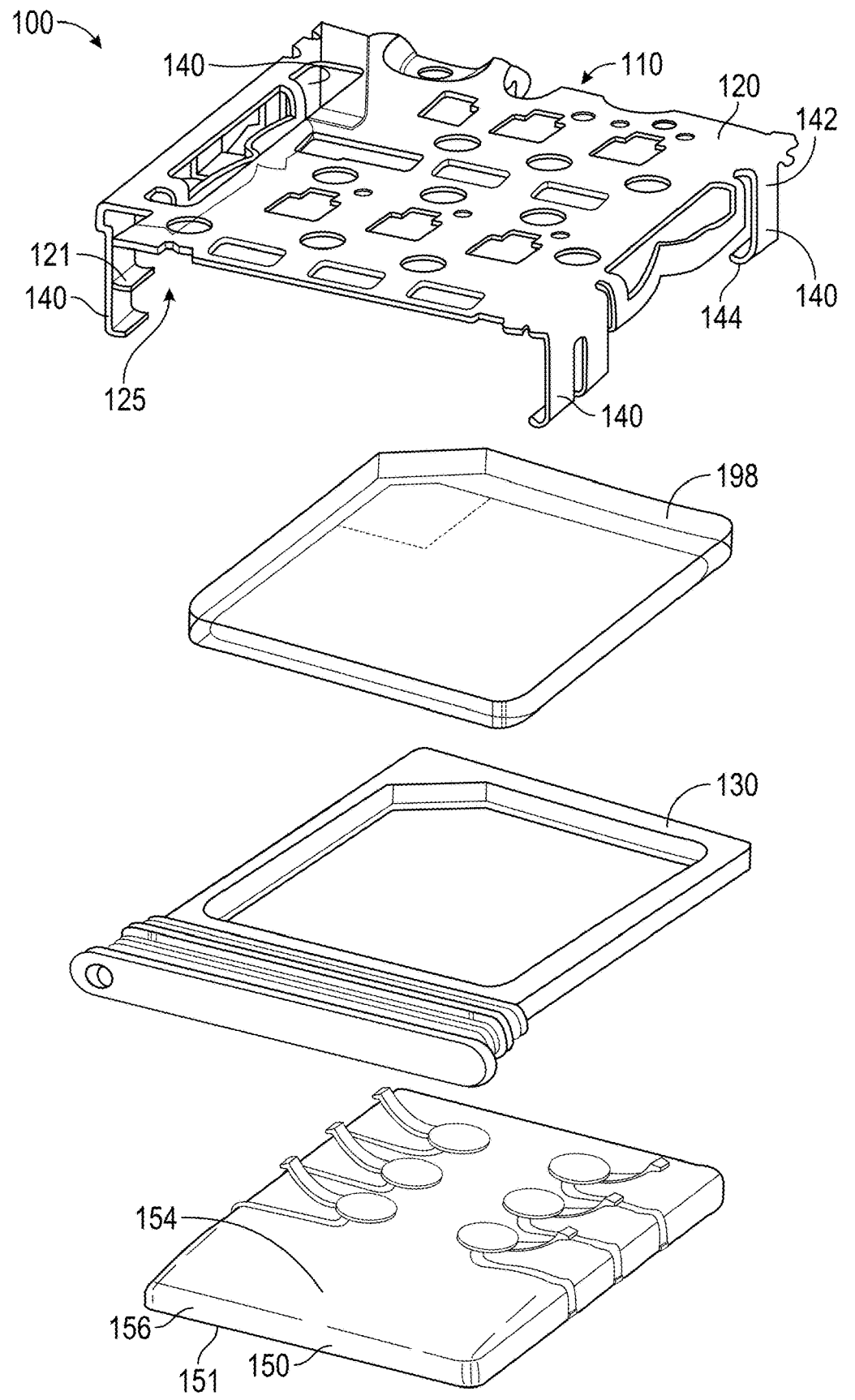
FIG. 2 is a perspective, exploded, top side view of the card connector assembly of FIG. 1.
Figure 3:
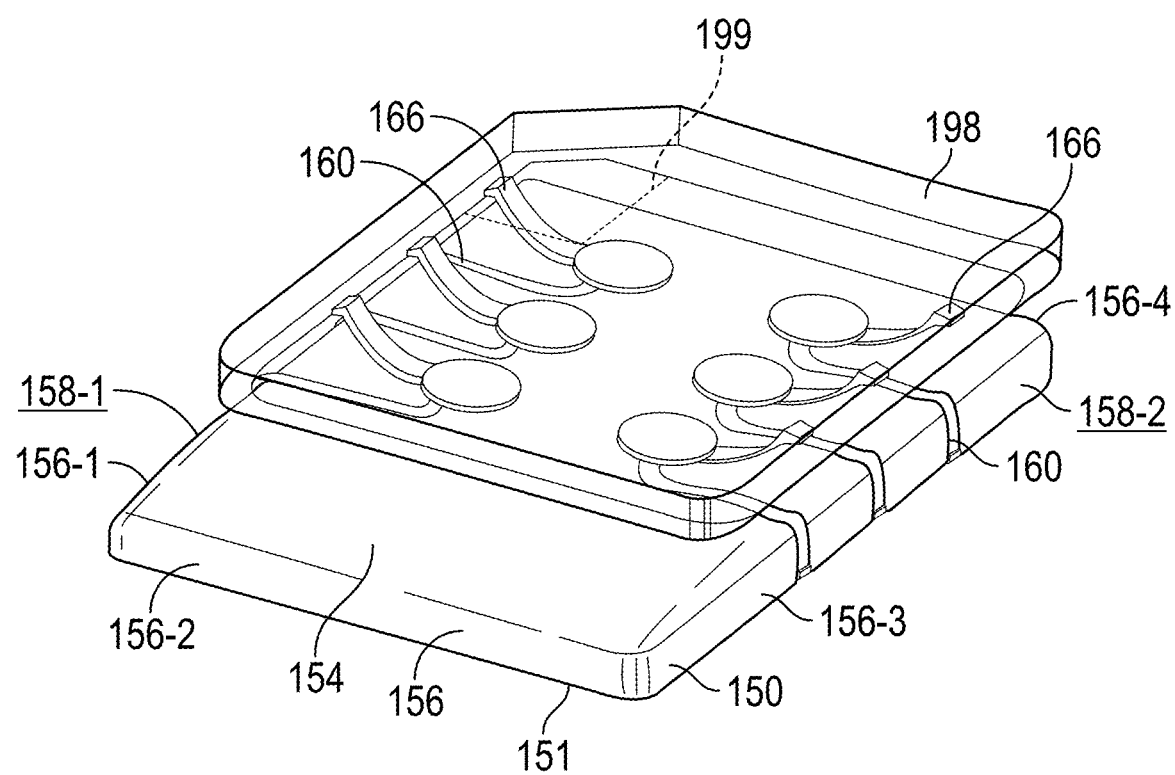
FIG. 3 is a partial, perspective, top side view that illustrates the shielded contact block and UICC of FIG. 1.
Figure 4:
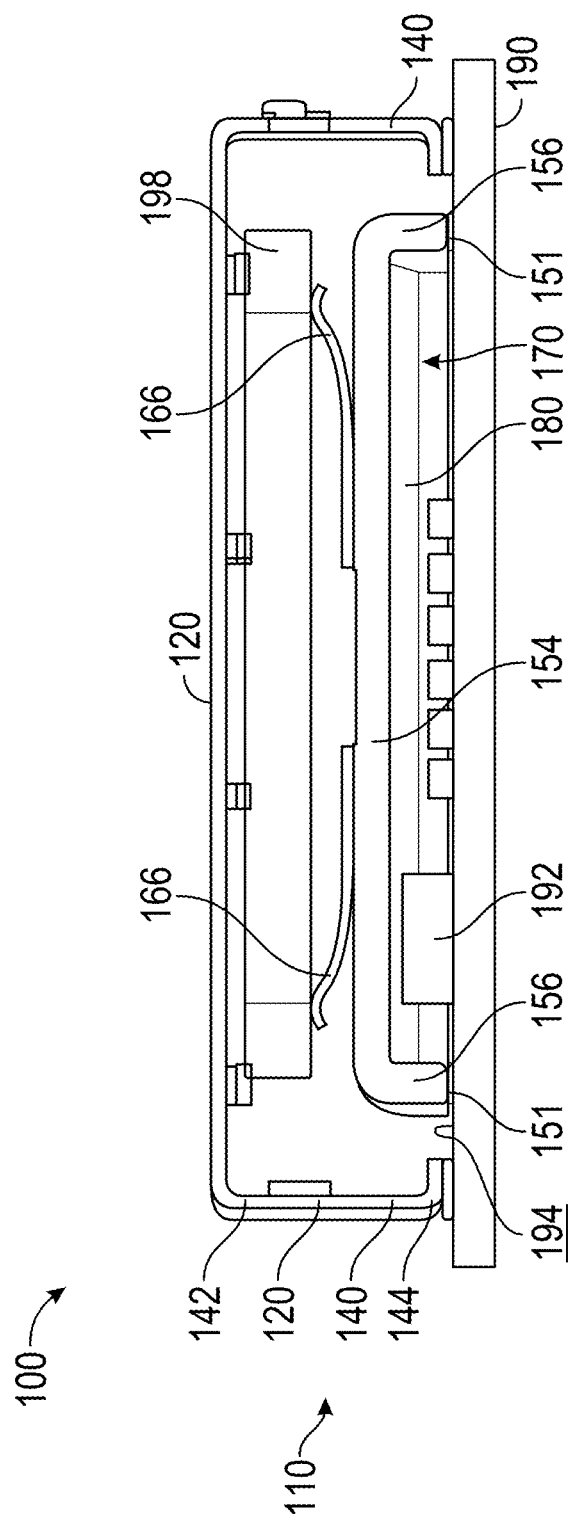
FIG. 4 is a cross-sectional view of the card connector assembly of FIG. 1.

FIGS. 1 through 7E illustrate a card connector assembly 100 with integrated component shielding. The card connector assembly 100 includes a card connector 110 configured to receive a universal integrated circuit card 198 (UICC 198), such as a subscriber identity module (SIM) card. The card connector 110 may be configured for surface mounting on a printed circuit board 190 (PCB 190), for example, as illustrated in FIG. 4. The PCB 190 (e.g., main logic board (MLB)) includes at least one electronic component 192 (illustrated in FIG. 4). The electronic component 192 may generate electromagnetic waves that cause interference.

Figure 1:
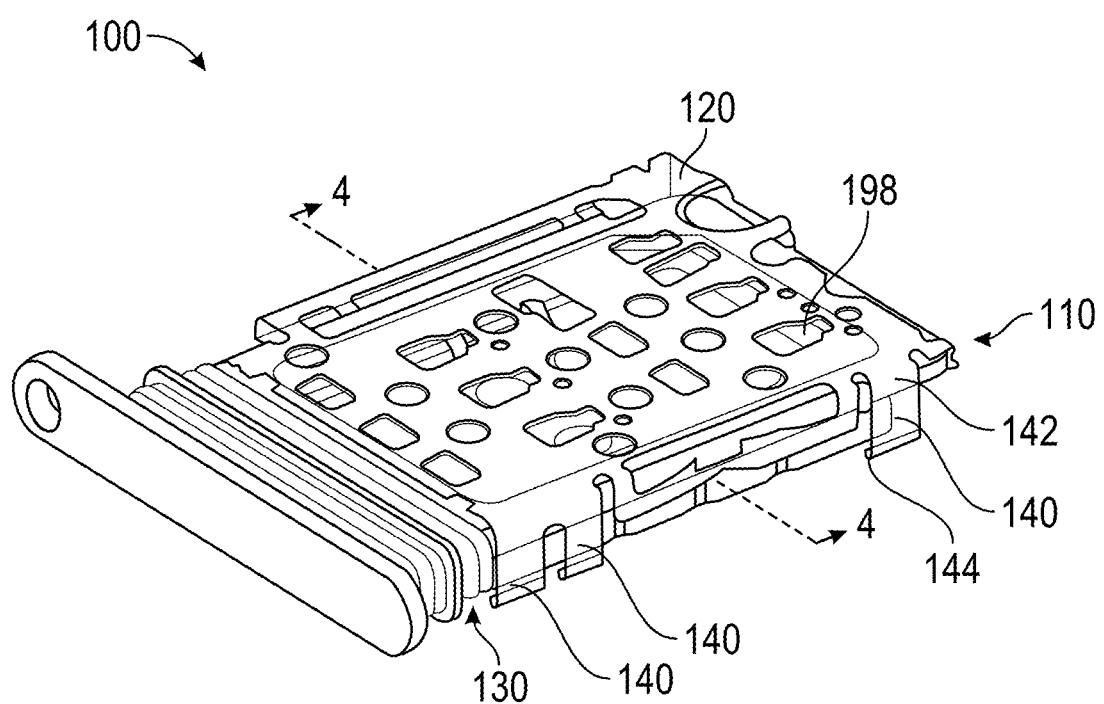
FIG. 1 is a perspective, top side view of a card connector assembly.

The card connector 110 includes a frame 120 and a riser 140. The frame 120 may support the UICC 198 relative to the PCB 190. The card connector 110 may include a card holder 130 that receives the UICC 198. The frame 120 is configured to receive the card holder 130. In aspects, the frame 120 defines a guide slot 125 between an upper wall 127 and one or more guides 121 that extend inwards from one or more of the risers 140. The guide slot 125 receives at least a portion of the card holder 130 or the UICC 198 therein. In FIGS. 1, 2, and 4, the card holder 130 is a SIM card tray that receives the UICC 198 therein. After the UICC 198 is placed in the SIM card tray, an end of the card holder 130 can be slid onto the guide(s) 121 and inserted into the guide slot 125.

The card holder 130 holds one or more pins 199 of the UICC 198 in engagement with one or more contact terminals. For example, holding one or more pins of the UICC 198 in engagement with one or more spring contact terminals 166 that extend from a shielded contact block 150, as illustrated in FIGS. 3 and 4. In other aspects, the card holder can include other types of structures that enable the UICC to be inserted into or supported by the frame, bringing one or more pins on a surface of the UICC into contact with contact terminals that extend from the shielded contact block.

In the aspects illustrated in FIGS. 2 and 4, the riser 140 has a first end 142 that extends from the card holder 130 and a second end 144 that is configured for surface mounting on the PCB 190 at one or more contact pads on the PCB 190. The riser 140 is configured as a standoff, which supports at least one of the card holder 130 or the UICC 198 spaced apart from an upper surface 194 of the PCB 190, as illustrated in FIG. 4. In FIG. 4, for clarity, the card holder 130 and related structures are not illustrated. By spacing the UICC 198 apart from the upper surface 194 of the PCB 190, a shielded space that receives a component shield (e.g., a shielded contact block 150) is defined.

The card connector 110 further includes a shielded contact block 150. The shielded contact block 150 is received between the card holder 130 and the PCB 190. The shielded contact block 150 is configured for surface mounting to the PCB 190 at a portion of a bottom rim 151, for example, through a soldering process. At least one interconnect (e.g., electronic circuit trace, conductive trace) is defined on the shielded contact block 150 that allows for connectivity between the UICC 198 and another component (e.g., the PCB 190).

In the card connector assembly 100 illustrated in FIGS. 1-6, the shielded contact block 150 has an upper wall 154 connected to a lateral wall 156. As illustrated in FIGS. 3 and 7A, in aspects, the lateral wall 156 may include multiple lateral walls, for example, lateral walls 156-1, 156-2, 156-3, and 156-43. The lateral wall 156 defines a bottom rim 151 at a lower edge. In aspects, the shielded contact block 150 includes an outer surface. The outer surface includes one or more of an upper wall outer surface 155 of the upper wall 154 or a lateral wall outer surface 158 of the lateral wall 156.

The shielded contact block 150 includes an interconnect (e.g., a conductive trace 160) that connects at least one pin 199 on the UICC 198 with at least one contact. For example, the conductive trace 160 illustrated in FIGS. 3 and 5 connects at least one pin 199 on the UICC 198 with at least one contact pad 196 on the PCB 190. In aspects, the interconnect is a conductive trace 160 defined on the outer surface of the shielded contact block 150, for example, on one or more of the upper wall outer surface 155 or the lateral wall outer surface 158. In the aspect illustrated in FIGS. 3 and 7D, six conductive traces 160 are defined on the upper wall outer surface 155, with three of the conductive traces 160 extending to a first lateral wall outer surface 158-1 and the other three of the conductive traces 160 extending to a second lateral wall outer surface 158-2.

The shielded contact block 150 may be a molded interconnect device (MID) with integrated electronic circuit traces that allow for connectivity between the UICC 198 and another component (e.g., the PCB 190). The shielded contact block 150 may be formed using an injection molding technique. The conductive trace 160 may be formed of a conductive metal applied to and/or provided on the shielded contact block 150 outer surfaces (e.g., upper wall outer surface 155, lateral wall outer surface 158) by laser direct structuring (LDS) or a similar conductive metal deposition process (e.g., metal spraying). Through LDS, a laser writes a course of a circuit trace onto a shielded contact block 150 formed of a thermoplastic material, doped with a (non-conductive) metallic inorganic compound. Through the laser writing the course of the circuit trace, the thermoplastic material is roughened, exposing (activating) the doped metallic inorganic compound. Through a subsequent metallization process, the exposed metallic inorganic compound form nuclei for the metallization of the traced circuit path. For example, the LDS MID may be exposed to a conductive metal bath (e.g., copper), and conductor path layers may be laid down in the laser written course, forming a conductor (e.g., conductive trace 160, component shield 180).

Figure 5:
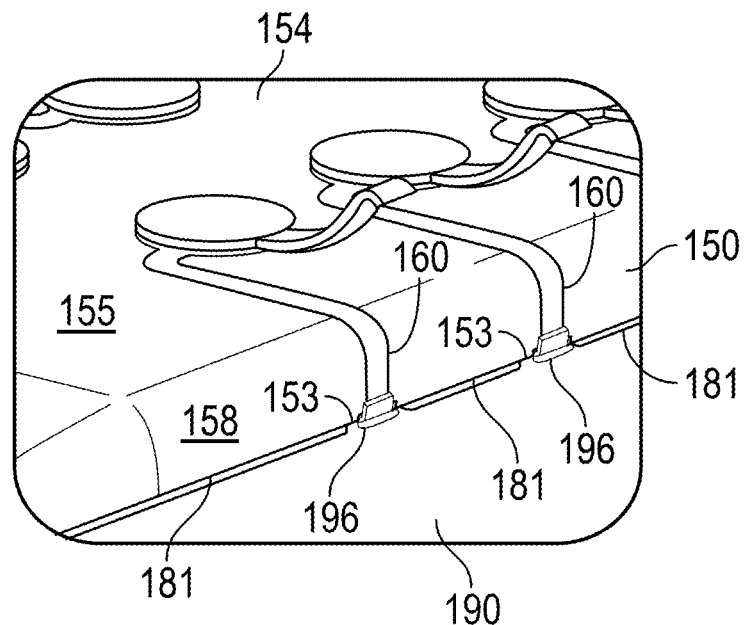
FIG. 5 is a partial, top side perspective view of the shielded contact block of FIG. 3.
Figure 6:
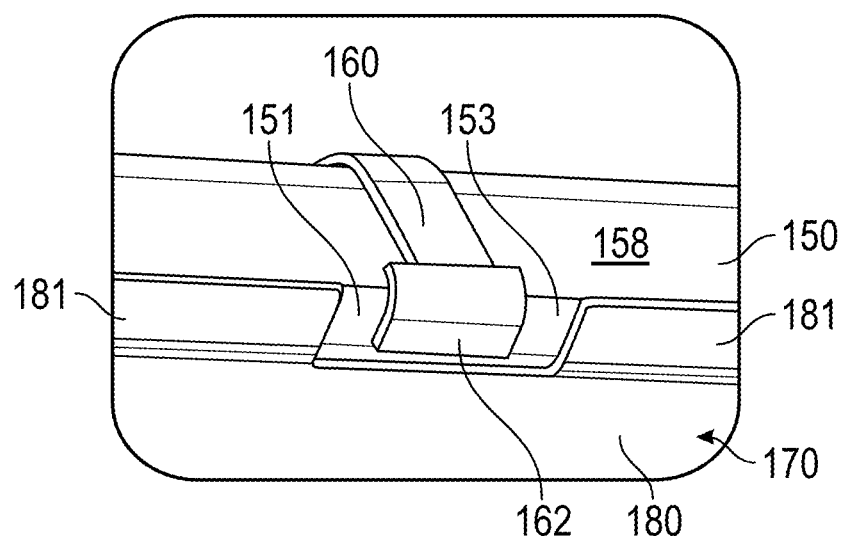
FIG. 6 is a partial, bottom side perspective view of the shielded contact block of FIG. 3.
Figure 7A:
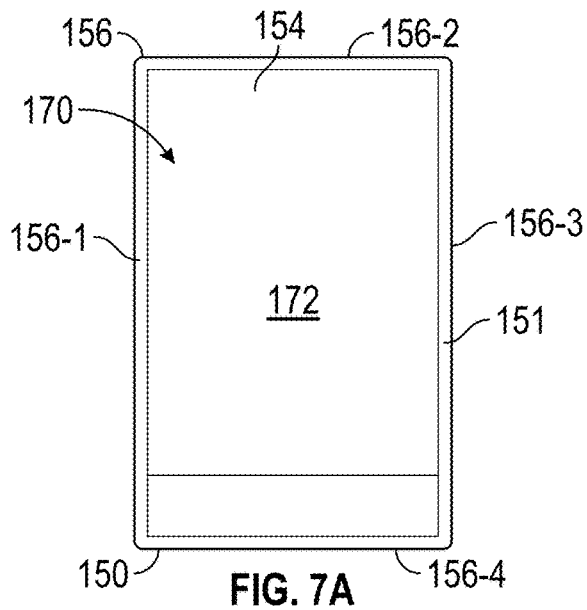
FIG. 7A is a first bottom plan view of the shielded contact block of FIG. 1.
Figure 7B:
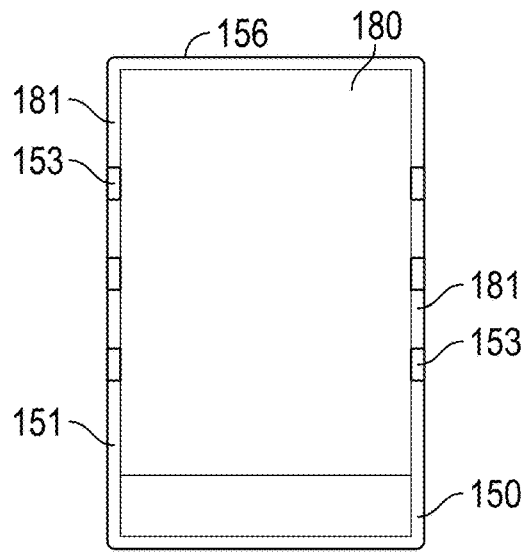
FIG. 7B is a second bottom plan view of the shielded contact block of FIG. 7A.
Figure 7C:
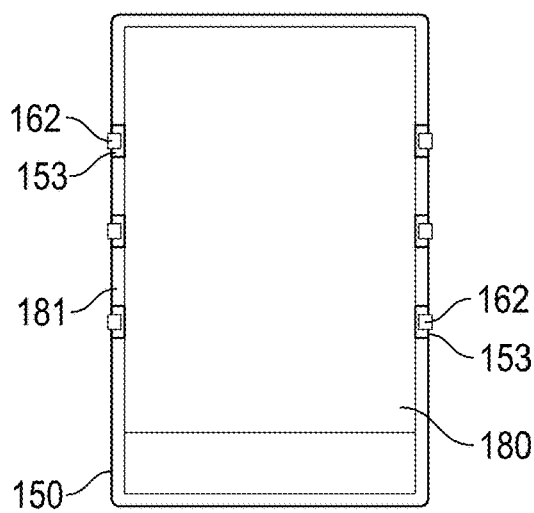
FIG. 7C is a third bottom plan view of the shielded contact block of FIG. 7A.
Figure 7D:
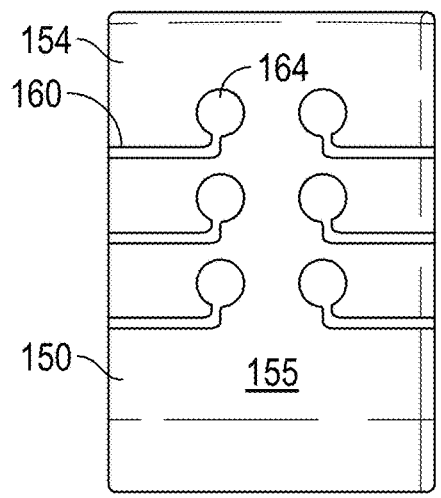
FIG. 7D is a top plan view of the shielded contact block of FIG. 7A.
Figure 7E:
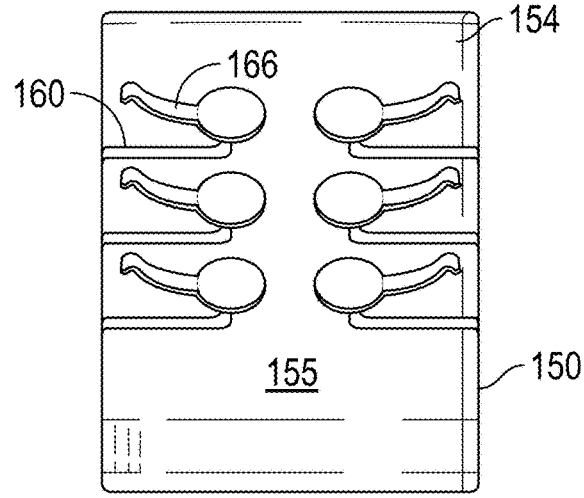
FIG. 7E is a top perspective view of the shielded contact block of FIG. 7A.

In the shielded contact block 150 illustrated in FIGS. 3, 5, 6, 7D, and 7E, the conductor formed is at least one conductive trace 160 extends from a contact 162 (illustrated in FIGS. 6 and 7C) located at a bottom rim 151 of the shielded contact block 150, along the lateral wall outer surface 158 and along the upper wall outer surface 155 to at least one pad 164 defined on the upper wall outer surface 155. On the shielded contact block 150 of FIGS. 7D and 7E illustrated are six conductive traces 160, with three of the conductive traces extending along a first side of the shielded contact block 150 and three of the conductive traces extending along a second side of shielded contact block 150. In other aspects, the conductive traces may extend along one or more of the surfaces of the shielded contact block 150.

On the shielded contact block 150 of FIGS. 7D and 7E, illustrated are six pads 164. A pad 164 may be formed of a conductive metal applied to and/or provided on the upper wall outer surface 155 by laser direct structuring (LDS) or a similar conductive metal deposition process.

A contact terminal (e.g., spring contact terminal 166) connects to and extends from the pad 164. In some aspects, a contact terminal may be laser welded to a pad 164. In other aspects, surface-mount technology (SMT) or another technique may be used to attach a contact terminal to a pad 164. On the shielded contact block 150 of FIG. 7E, illustrated are six spring contact terminals 166. Each spring contact terminal 166 may contact a pin 199 on the UICC 198, as illustrated in FIG. 3.

The upper wall 154 and the lateral wall 156 of the shielded contact block 150 define at least one recess 170 that receives a portion of the electronic component 192 therein, as illustrated in FIG. 4. The recess 170 may be enclosed by lateral walls or may be open-ended. The recess 170 includes an inner surface 172 (illustrated in FIG. 7A). In aspects, the upper wall 154 and the lateral wall(s) 156 of a shielded contact block 150 may define multiple recesses.

The shielded contact block 150 may include a component shield 180 located in the recess 170, as illustrated in FIGS. 4, 6, 7B, and 7C. The component shield 180 defines at least one shielded area configured to attenuate electromagnetic waves generated by one or more electronic components 192 on the PCB 190, such as electronic components located in a radio frequency (RF) region of the PCB. In aspects, the component shield 180 may define multiple shielded areas. In some aspects, the upper wall 154 and the lateral wall(s) 156 of a shielded contact block 150 may define multiple recesses, and a component shield 180 may be located in one or more of the recesses.

In aspects, the component shield 180 is formed of a conductive metal applied to and/or provided on at least a portion of the inner surface 172 of the shielded contact block 150, for example, through LDS or a conductive metal deposition process (e.g., metal spraying). The component shield 180 may be applied through the use of the process described above for applying the conductive trace 160.

In aspects, for example, as illustrated in FIGS. 5, 6, 7B, and 7C, the component shield 180 extends along inner surface 172 of the recess 170 to a shield lip 181. The shield lip 181 extends along at least a portion of the bottom rim 151 of the shielded contact block 150. As illustrated in FIGS. 5 and 6, the shield lip 181 may extend along the bottom rim 151 in multiple places. At the shield lip 181, the component shield 180 may be disposed to be in contact with the PCB 190, and the shield lip 181 may be fixed to the PCB through a soldering process. In aspects, the component shield 180 contacts the PCB 190 at a ground portion of the PCB 190 (e.g., the ground plane of the PCB 190).

One or more cutout portions 153 (cutouts 153) may be defined in the bottom rim 151 of the shielded contact block 150, which interrupts the shield lip 181, for example, as illustrated in FIGS. 5, 6, and 7C. The cutout 153 may define a surface to which the component shield 180 is not deposited. The cutout 153 may receive a contact 162 of the conductive trace 160. In the shielded contact block 150 of FIG. 7C six contacts 162 are illustrated. In aspects, the contact(s) 162 are fixed to the PCB 190 or another component at a terminal through a soldering process. For example, at a contact pad 196 on the PCB 190, as illustrated in FIGS. 4 and 5.

In other aspects, the card connector assemblies with integrated component shielding for electronic devices define a printed circuit board (PCB) assembly that includes a PCB, an electronic component mounted on the PCB, and a card connector for a UICC, such as is described above.

FIGS. 7A through 7E illustrate a process of manufacturing a shielded contact block, such as the shielded contact block 150 of FIGS. 1-6. FIGS. 7A-7C are bottom plan views, FIG. 7D is a top plan view and FIG. 7E is a top perspective view. In FIG. 7A, an injection molding technique is utilized to form a shielded contact block 150. The shielded contact block 150 may be formed of a thermoplastic material, doped with a (non-conductive) metallic inorganic compound.

The shielded contact block 150 may include an upper wall 154 and at least one lateral wall 156. The aspect illustrated in FIG. 7A, the shielded contact block 150 includes four lateral walls: lateral wall 156-1, lateral wall 156-2, lateral wall 156-3, and lateral wall 156-4. The lateral walls 165 include a bottom rim 151. The upper wall 154 has an inner surface 172, and the lateral walls 156 have a lateral wall inner surface 157.

In FIG. 7B, at least one cutout 153 may be defined on the bottom rim 151 of the shielded contact block 150. A component shield 180, which includes at least one shield lip 181, can then be formed on the inner surface 172, the lateral wall inner surface 157, and the portions of the bottom rim 151 that do not include the cutout(s) 153. For example, using laser direct structuring (LDS) or a similar conductive metal deposition process (e.g., metal spraying), as described above.

As illustrated in FIGS. 7C and 7D, at least one conductive trace 160 is formed on the outside of the shielded contact block 150, for example, using LDS or a similar conductive metal deposition process. The conductive trace 160 may extend from a pad 164 on the upper wall outer surface 155, along the lateral wall outer surface 158, and to a contact 162 located on a cutout 153. The aspect illustrated in FIG. 7C includes six contacts 162. The aspect illustrated in FIG. 7D includes six conductive traces 160 and six pads 164. In FIG. 7E, a contact terminal (e.g., spring contact terminal 166) is attached to at least one of the pads, as described above, to form the shielded contact block 150.

Although concepts of techniques and apparatuses, including card connector assemblies with integrated component shielding for electronic devices, have been described in language specific to techniques and/or apparatuses, it is to be understood that the subject of the appended claims is not necessarily limited to the specific techniques or apparatuses described. Rather, the specific techniques and apparatuses are disclosed as example implementations of ways in which card connector assemblies with integrated component shielding for electronic devices may be implemented.

What is claimed is:

1. An apparatus comprising:
a card connector for a universal integrated circuit card (UICC), the card connector configured for surface mounting on a printed circuit board (PCB) including an electronic component, the card connector comprising:
a frame, the frame comprising a card holder configured for receiving the UICC;
a riser configured for supporting the card holder spaced apart from the PCB; and
a shielded contact block configured for surface mounting to the PCB, the shielded contact block comprising:
an upper surface opposite a bottom surface;
at least one sidewall extending away from the bottom surface;
an outer surface defined by the upper surface and an outside of the sidewall;
an inner surface defined by the bottom surface and an inside surface of the sidewall;
a recess defined by the inside of the sidewall and the bottom surface, the recess configured for receiving the electronic component therein;
an interconnect comprising a conductive trace defined on the outer surface of the shielded contact block, the interconnect configured for connecting with a contact pad on the PCB and configured for connecting with a pin on the UICC; and
a component shield on the inner surface of the shielded contact block and located in the recess, the component shield defining a shielded area configured for attenuating electromagnetic waves generated by the electronic component.

2. The apparatus of claim 1, wherein the conductive trace comprises a conductive metal applied to the outer surface of the shielded contact block by laser direct structuring.

3. The apparatus of claim 1, wherein the component shield comprises a conductive metal applied to the inner surface of the shielded contact block by laser direct structuring.

4. The apparatus of claim 1, wherein the conductive trace comprises a conductive metal applied to the outer surface of the shielded contact block by laser direct structuring, and wherein the component shield comprises a conductive metal applied to the inner surface of the shielded contact block by laser direct structuring.

5. A printed circuit board (PCB) assembly comprising:
a PCB;
an electronic component mounted on the PCB;
a card connector for a universal integrated circuit card (UICC), the card connector surface mounted on the PCB, the card connector comprising:
a frame, the frame comprising a card holder configured for receiving a UICC;
a riser supporting the card holder spaced apart from the PCB; and
a shielded contact block surface mounted to the PCB, the shielded contact block comprising:
an upper surface opposite a bottom surface;
at least one sidewall extending away from the bottom surface;
an outer surface defined by the upper surface and an outside of the sidewall;
an inner surface defined by the bottom surface and an inside surface of the sidewall;
a recess defined by the inside of the sidewall and the bottom surface, the recess receiving the electronic component therein;
an interconnect comprising a conductive trace defined on the outer surface of the shielded contact block, the interconnect connected to a contact pad on the PCB and configured for connecting with a pin on the UICC; and
a component shield on the inner surface of the shielded contact block and located in the recess, the component shield defining a shielded area configured for attenuating electromagnetic waves generated by the electronic component.

6. The PCB assembly of claim 5, wherein the conductive trace comprises a conductive metal applied to the outer surface of the shielded contact block by laser direct structuring.

7. The PCB assembly of claim 5, wherein the component shield comprises a conductive metal applied to the inner surface of the shielded contact block by laser direct structuring.

8. The PCB assembly of claim 5, wherein the conductive trace comprises a conductive metal applied to the outer surface of the shielded contact block by laser direct structuring, and wherein the component shield comprises a conductive metal applied to the inner surface of the shielded contact block by laser direct structuring.

* * * * *